United States Patent
Jiang et al.

(10) Patent No.: US 10,014,323 B2
(45) Date of Patent: Jul. 3, 2018

(54) ARRAY SUBSTRATE, CURVED DISPLAY PANEL AND CURVED DISPLAY DEVICE

(71) Applicants: BOE TECHNOLOGY GROUP CO., LTD., Beijing (CN); HEFEI XINSHENG OPTOELECTRONICS TECHNOLOGY CO., LTD., Anhui (CN)

(72) Inventors: Liangliang Jiang, Beijing (CN); Lei Guo, Beijing (CN); Fengzhen Lv, Beijing (CN)

(73) Assignees: BOE TECHNOLOGY GROUP CO., LTD. (CN); HEFEI XINSHENG OPTOELECTRONICS TECHNOLOGY CO., LTD. (CN)

( * ) Notice: Subject to any disclaimer, the term of this patent is extended or adjusted under 35 U.S.C. 154(b) by 0 days.

(21) Appl. No.: 15/314,624

(22) PCT Filed: Mar. 9, 2016

(86) PCT No.: PCT/CN2016/075927
§ 371 (c)(1),
(2) Date: Nov. 29, 2016

(87) PCT Pub. No.: WO2017/049884
PCT Pub. Date: Mar. 30, 2017

(65) Prior Publication Data
US 2017/0287944 A1    Oct. 5, 2017

(30) Foreign Application Priority Data
Sep. 24, 2015   (CN) .......................... 2015 1 0618603

(51) Int. Cl.
*H01L 27/12*   (2006.01)

(52) U.S. Cl.
CPC ........ *H01L 27/1218* (2013.01); *H01L 27/124* (2013.01)

(58) Field of Classification Search
None
See application file for complete search history.

(56) References Cited

U.S. PATENT DOCUMENTS

| 2007/0229748 A1 | 10/2007 | Fujita | |
| 2013/0002974 A1* | 1/2013 | Minato | G02B 5/201 349/43 |

(Continued)

FOREIGN PATENT DOCUMENTS

| CN | 101046593 A1 | 10/2007 |
| CN | 104007590 A | 8/2014 |

(Continued)

OTHER PUBLICATIONS

International Search Report and Written Opinion for Application No. PCT/CN2016/075927, dated Jun. 23, 2016, 12 Pages.

(Continued)

*Primary Examiner* — Michelle Mandala
(74) *Attorney, Agent, or Firm* — Brooks Kushman P.C.

(57) ABSTRACT

An array substrate, a curved display panel and a curved display device are provided, to improve visual effect and image quality of the display panel being curved by external force. The array substrate includes multiple pixel units arranged in a matrix, each pixel unit comprises at least two sub-pixel units, and each sub-pixel unit is provided with a pixel electrode and a common electrode. The pixel electrodes and/or the common electrodes in an identical pixel unit have an identical structure, and the pixel electrodes or the common electrodes in different pixel units have at least two structures. The pixel electrodes or the common electrodes are symmetrically arranged relative to a central axis of the array substrate. The central axis is a straight line (Continued)

located in the center of the array substrate and extending in a direction parallel to the array substrate, and an extending direction of the central axis does not change when the array substrate is curved.

19 Claims, 5 Drawing Sheets

(56) References Cited

U.S. PATENT DOCUMENTS

| | | | |
|---|---|---|---|
| 2015/0168787 A1 | 6/2015 | Yang et al. | |
| 2016/0070144 A1 | 3/2016 | Jin et al. | |
| 2016/0139458 A1 | 5/2016 | Ma | |
| 2016/0187745 A1* | 6/2016 | Jin | G02F 1/134336 349/110 |
| 2016/0202581 A1* | 7/2016 | Yu | G02F 1/134309 257/72 |
| 2016/0238906 A1 | 8/2016 | Wu et al. | |

FOREIGN PATENT DOCUMENTS

| | | |
|---|---|---|
| CN | 104122715 A | 10/2014 |
| CN | 104181735 A | 12/2014 |
| CN | 104199223 A1 | 12/2014 |
| CN | 104375339 A | 2/2015 |
| CN | 104793422 A | 7/2015 |
| CN | 105093727 A | 11/2015 |

OTHER PUBLICATIONS

First Office Action for Chinese Application No. 201510618603.2, dated Sep. 27, 2017, 6 Pages.

\* cited by examiner

ARRAY SUBSTRATE, CURVED DISPLAY PANEL AND CURVED DISPLAY DEVICE

CROSS-REFERENCE TO RELATED APPLICATION

This application is the U.S. national phase of PCT Application No. PCT/CN2016/075927 filed on Mar. 9, 2016, which claims priority to Chinese Patent Application No. 201510618603.2 filed on Sep. 24, 2015, the disclosures of which are incorporated in their entirety by reference herein.

TECHNICAL FIELD

The present disclosure relates to the field of display technology, and in particular, to an array substrate, a curved display panel and a curved display device.

BACKGROUND

Currently in the field of Curved Thin Film Transistor-Liquid Crystal Display (TFT-LCD), usually a liquid crystal display panel formed through a plane alignment is curved under external force to generate a curved structure; here, the curving extent is determined based on designed size of the panel and observing distance from the panel. As shown in FIG. 1, a color filter substrate 11 and an array substrate 12 aligned plane to plane are curved under external force, and a radius of curvature R is determined based on designed size and observing distance. When the color filter substrate 11 and the array substrate 12 are planes, pixel transparent regions of the color filter substrate 11 and pixel electrodes on the array substrate 12 are in one-to-one correspondence. After the color filter substrate 11 and the array substrate 12 are curved, the pixel transparent regions of the color filter substrate 11 move a lot with respect to the corresponding pixel electrodes on the array substrate 12; in addition, movements of the pixel transparent regions at the left side and the right side of a central line 10 are opposite.

For achieving wide viewing angle, high transmittance and rapid response with the In-Plane-Switching (IPS) liquid crystal display panel and Fringe Filed Switching (FFS) liquid crystal display panel in related technologies, usually, pixel electrodes are designed into a double-domain structure having inclined slits. As shown in FIG. 2, the pixel electrode 21 is a slit electrode, the pixel electrode 21 located in one sub-pixel unit is in shape of a right angle bracket. Due to the differences between the two domains and the electric field around, the liquid crystals at the central and edge regions of the pixel electrode 21 may generate disordered deflections, which results in low transmittance and dark fringe regions 22. The deflections of the liquid crystals in the whole pixel display region are not even and the transmittance of the whole pixel display region is not even.

Since in the related technologies, the pixel electrode in the array substrate adopts a double-domain structure having inclined slits, in the case that the liquid crystal display panel formed by the array substrate and the color filter substrate is not curved, all the pixels have a substantially identical aperture ratio and a substantially identical transmittance. In this way, different regions of the liquid crystal display panel present same brightness and similar transmittances, which leads to good visual effects for observers. As shown in FIG. 3, the numerical reference 31 represents light emitted from three sub-pixels of one pixel, the numerical reference 32 represents the liquid crystal layer between the color filter substrate 11 and the array substrate 12, the numerical reference 33 represents spacers between the color filter substrate 11 and the array substrate 12.

As shown in FIG. 4, in the case that the liquid crystal display panel formed by the array substrate and the color filter substrate is curved, the pixel transparent regions of the color filter substrate 11 move a lot with respect to the corresponding pixel electrodes in the array substrate 12; in addition, movements of the pixel transparent regions at the left side and the right side of the central line 10 are opposite. In this case, the liquid crystal display panel is subjected to severe light leakage and color mixture. Currently, the light leakage and color mixture are compensated by increasing the width of the black matrix; however, the aperture ratio and transmittance of the liquid crystal display panel are decreased. As shown in FIG. 2 and FIG. 4, left and right side of the dark fringe area of each pixel electrode is not completely symmetric, and the transmittance on the left of the central line 10 is smaller than the transmittance on the right of the central line 10; hence, the visual effect and image quality of the liquid crystal display panel are not good.

In sum, when the plane display panel in the related technologies is curved under external force, the visual effect and image quality are not good.

SUMMARY

An array substrate, a curved display panel and a curved display device are provided in some embodiments of the present disclosure, to improve visual effect and image quality when the display panel is curved under external force.

An array substrate is provided in some embodiments of the present disclosure, including a plurality of pixel units arranged in a matrix, wherein each pixel unit comprises at least two sub-pixel units, and each sub-pixel unit is provided with a pixel electrode and a common electrode. At least one kind of the pixel electrodes and the common electrodes in an identical pixel unit have an identical structure, and at least one kind of the pixel electrodes and the common electrodes in different pixel units have at least two structures comprising a first structure and a second structure. The at least one kind of the pixel electrodes and the common electrodes are symmetrically arranged relative to a central axis of the array substrate, the central axis is a straight line at a middle portion of the array substrate and extending in a direction parallel to the array substrate, and an extending direction of the central axis does not change in the case that the array substrate is curved.

When the array substrate provided by the present disclosure and the color filter substrate that are oppositely arranged to form a cell are curved under external force, since the at least one kind of the pixel electrodes and the common electrodes in an identical pixel unit have an identical structure, the at least one kind of the pixel electrodes and the common electrodes in different pixel units have at least two different structures, and the at least one kind of the pixel electrodes and the common electrodes are symmetrically arranged relative to the central axis of the array substrate, the pixel units at the left side of a central axis of a liquid crystal display panel formed by the array substrate and the color filter substrate and the pixel units at the right side of the central axis of the liquid crystal display panel have an identical quantity and are symmetrically arranged relative to the central axis. Compared with designing the pixel electrodes with only one structure, the movement of the color filter substrate in some embodiments of the present disclosure has same effect on deflections of the liquid crystals and transmittance, and accordingly, the panel may have an even transmittance and an even brightness, thereby improving the visual effect and the image quality.

Optionally, each pixel unit includes three sub-pixel units, and the at least one kind of the pixel electrodes and the common electrodes in any two adjacent pixel units located in an identical row have different structures. A row direction is perpendicular to the extending direction of the central axis.

Optionally, each pixel unit comprises three sub-pixel units, the at least one kind of the pixel electrodes and the common electrodes in the pixel units located in an identical row at one side of the central axis have an identical structure, and the at least one kind of the pixel electrodes and the common electrodes in the pixel units located in an identical row at the other side of the central axis have an identical structure, wherein a row direction is perpendicular to the extending direction of the central axis.

Optionally, each pixel unit includes four sub-pixel units, the four sub-pixel units are horizontally lined up or arranged in a two-by-two array, and the at least one kind of the pixel electrodes and the common electrodes in any two adjacent pixel units located in an identical row have different structures. The row direction is perpendicular to the extending direction of the central axis.

Optionally, each pixel unit includes four sub-pixel units, the four sub-pixel units are horizontally lined up or arranged in a two-by-two array, the at least one kind of the pixel electrodes and the common electrodes in the pixel units located in an identical row at one side of the central axis have an identical structure, and the at least one kind of the pixel electrodes and the common electrodes in the pixel units located in an identical row at the other side of the central axis have an identical structure. A row direction is perpendicular to the extending direction of the central axis.

Optionally, the at least one kind of the pixel electrodes and the common electrodes in the pixel units located in an identical column have an identical structure, and a column direction is parallel to the extending direction of the central axis.

Optionally, each of the at least one kind of the pixel electrodes and the common electrodes includes a group of slits, the slits of the at least one kind of the pixel electrodes and the common electrodes are symmetrically arranged relative to the central axis of the array substrate, and each of the at least one kind of the pixel electrodes and the common electrodes includes a plurality of slits bending toward an identical direction. Each slit of the at least one kind of the pixel electrodes and the common electrodes having the first structure includes a bending point at a middle portion of the corresponding slit and bends toward a first direction, or each slit of the at least one kind of the pixel electrodes and the common electrodes having the first structure inclines toward the first direction. Each slit of the at least one kind of the pixel electrodes and the common electrodes having the second structure includes a bending point at a middle portion of the corresponding slit and bends toward a second direction, or each slit of the at least one kind of the pixel electrodes and the common electrodes having the second structure inclines toward the second direction. The first direction is opposite to the second direction, and the first and the second directions are both perpendicular to the central axis.

Optionally, the bending point at the middle portion of each slit of the at least one kind of the pixel electrodes and the common electrodes and two terminals of the corresponding slit form an isosceles triangle. The bending point is a vertex of the isosceles triangle.

Optionally, a portion of each slit of the at least one kind of the pixel electrodes and the common electrodes between the bending point at the middle portion of the corresponding slit and each of two terminals of the corresponding slit is straight; or a portion of each slit of the at least one kind of the pixel electrodes and the common electrodes between the bending point at the middle portion of the corresponding slit and each of two terminals of the corresponding slit is curved.

Optionally, the pixel units in respective rows have an identical quantity and the sub-pixel units in respective pixel units have an identical quantity. The pixel units located in an identical row and at two sides of the central axis have an identical quantity, and structures of the pixel units located in the identical row and at the two sides of the central axis are symmetrically arranged relative to the central axis. A row direction is perpendicular to the extending direction of the central axis.

Optionally, the at least one kind of the pixel electrodes and the common electrodes in respective rows have an identical quantity. The at least one kind of the pixel electrodes and the common electrodes located in an identical row and at two sides of the central axis have an identical quantity, and structures of the at least one kind of the pixel electrodes and the common electrodes located in the identical row and at the two sides of the central axis are symmetrically arranged relative to the central axis. The row direction is perpendicular to the extending direction of the central axis.

Optionally, the slits of the at least one kind of the pixel electrodes and the common electrodes in an identical pixel unit bend toward an identical direction.

A curved display panel is provided by the present disclosure, including the above array substrate and an alignment substrate. After the array substrate and the alignment substrate are oppositely arranged to form a cell, a section along an extending direction of a long axis of the array substrate has an arc surface.

A curved display device is provided by the present disclosure, including the above curved display panel.

DETAILED DESCRIPTION

An array substrate, a curved display panel and a curved display device are provided in some embodiments of the present disclosure, to improve visual effect and image quality when the display panel is curved under external force.

To clarify objectives, technical solutions and advantages of the present disclosure, the present disclosure is detailed hereinafter in conjunction with drawings. Apparently, the described embodiments are merely a part of, rather than all of, embodiments of the present disclosure. Any other embodiment obtained by those skilled in the art based on the embodiments of the present disclosure without paying inventive efforts shall fall into the scope of the present disclosure.

An array substrate in some embodiments of the present disclosure is detailed hereinafter in conjunction with the drawings.

Figure 5:
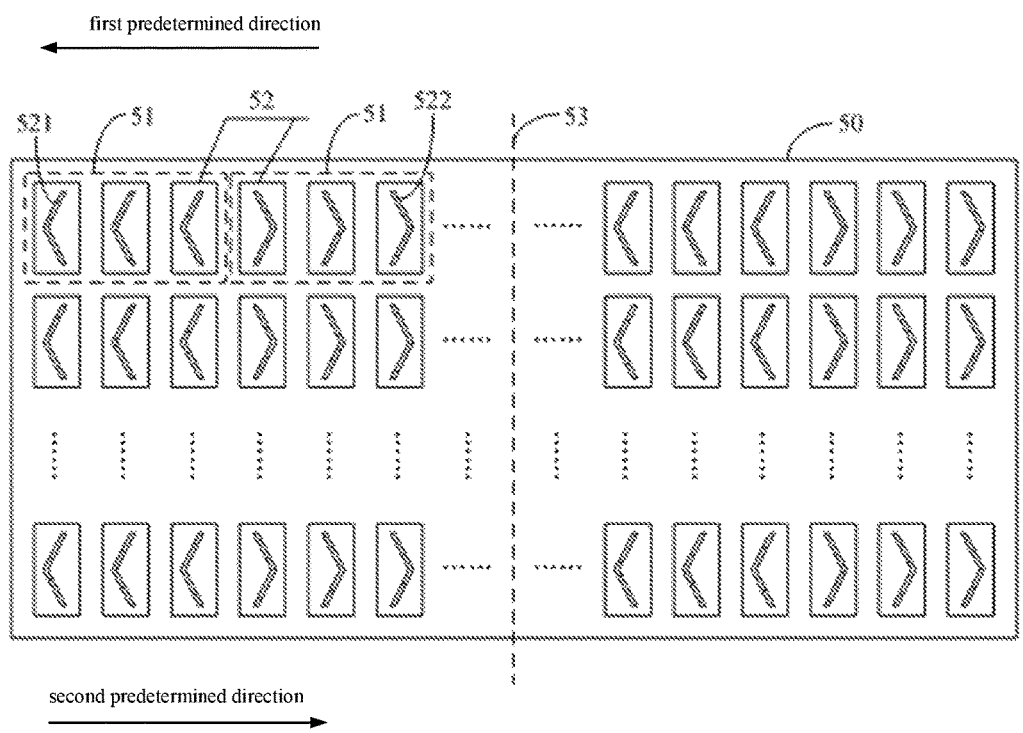
FIG. 5 is a schematic plan view of an array substrate in some embodiments of the present disclosure.

FIG. 5 illustrates an array substrate in some embodiments of the present disclosure, including a plurality of pixel units 51 that are arranged in a matrix. Each pixel unit 51 includes at least two sub-pixel units, and here in FIG. 5, it is taken as an example that each pixel unit 51 includes three sub-pixel units. Each sub-pixel unit is provided with one pixel electrode 52 and a common electrode (not shown in FIG. 5). The pixel electrodes 52 or the common electrodes in an identical pixel unit 51 have an identical structure, while the pixel electrodes 52 or the common electrodes in different pixel units 51 have at least two different structures, i.e., a first structure and a second structure. In FIG. 5, it is taken as an example that the pixel electrodes have two different structures.

The pixel electrodes 52 or the common electrodes are symmetrically arranged relative to a central axis 53 of the array substrate 50. The central axis 53 is a straight line located in the center of the array substrate 50 and extending in a direction parallel to the array substrate 50. The extending direction of the central axis 53 does not change when the array substrate 50 is curved.

In some embodiments of the present disclosure, the arrangement of the pixel electrodes are described for example, while the arrangement of the common electrodes is similar and is not repeated herein.

As shown in FIG. 5, in some embodiments of the present disclosure, each pixel electrode 52 includes a group of slits. The slits of the pixel electrodes are symmetrically arranged relative to the central axis 53 of the array substrate. Each pixel electrode 52 has a plurality of slits bending toward an identical direction. In FIG. 5, only one slit is shown in each pixel electrode 52.

As shown in FIG. 5, in the pixel electrode 52 having the first structure, each slit 521 includes a bending point at a middle portion thereof and bends toward a first predetermined direction, or each slit of the pixel electrodes 52 having the first structure inclines toward the first predetermined direction. In the pixel electrode 52 having the second structure, each slit 522 includes a bending point at a middle portion thereof and bends toward a second predetermined direction, or each slit of the pixel electrodes 52 having the second structure inclines toward the second predetermined direction. In some embodiments of the present disclosure, the first predetermined direction points horizontally to the left and the second predetermined direction points horizontally to the right.

As shown in FIG. 5, the bending point of each slit 521 of the pixel electrodes 52 is at the middle portion of the slit 521, and the bending point and two terminals of the slit 521 form an isosceles triangle, where the bending point is a vertex of the isosceles triangle. The bending point is the middle point of the slit 521. The bending point of each slit 522 of the pixel electrodes 52 is at the middle portion of the slit 522, and the bending point and two terminals of the slit 522 form an isosceles triangle, where the bending point is a vertex of the isosceles triangle. The bending point is the middle point of the slit 522.

In some embodiments of the present disclosure, a portion of each slit of the pixel electrodes between the bending point at the middle portion of the corresponding slit and each of two terminals of the corresponding slit is straight, such that the slit is in shape of left angle bracket or right angle bracket, as shown in FIG. 5. Or, a portion of each slit of the pixel electrodes or the common electrodes between the bending point at the middle portion of the corresponding slit and each of two terminals of the corresponding slit is curved, such that the slit is in shape of left round bracket or right round bracket.

To be specific, in some embodiments of the present disclosure, the pixel electrodes 52 are in different structures. Taking a first row of pixel units for example, each slit of the pixel electrodes in a first pixel unit is in shape of left angle bracket, each slit of the pixel electrodes in a second pixel unit is in shape of right angle bracket, each slit of the pixel electrodes in a third pixel unit is in shape of left round bracket, each slit of the pixel electrodes in a fourth pixel unit is in shape of right angle bracket, and so forth, as long as the pixel electrodes in the pixel units are symmetrically arranged relative to the central axis of the array substrate.

Of course, in an actual design, the pixel units at one side of the central axis of the array substrate are located in four different regions. Each slit of the pixel electrodes in the pixel units located in a first region is in shape of left angle bracket, each slit of the pixel electrodes in the pixel units located in a second region is in shape of right angle bracket, each slit of the pixel electrodes in the pixel units located in a third region is in shape of left round bracket, each slit of the pixel electrodes in the pixel units located in a fourth region is in shape of right round bracket. The pixel electrodes in pixel units at another side of the central axis are correspondingly designed such that the pixel electrodes in the pixel units at two sides of the central axis of the array substrate are symmetric relative to the central axis.

Figure 1:
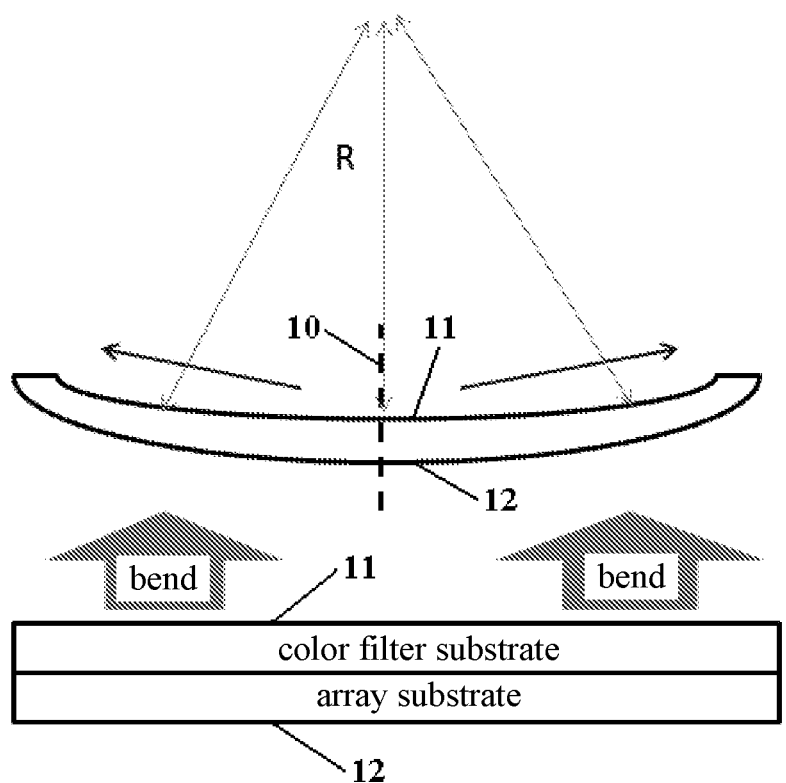
FIG. 1 is a schematic view of a curved liquid crystal display panel formed by bending a plane liquid crystal display panel in the related art.
Figure 2:
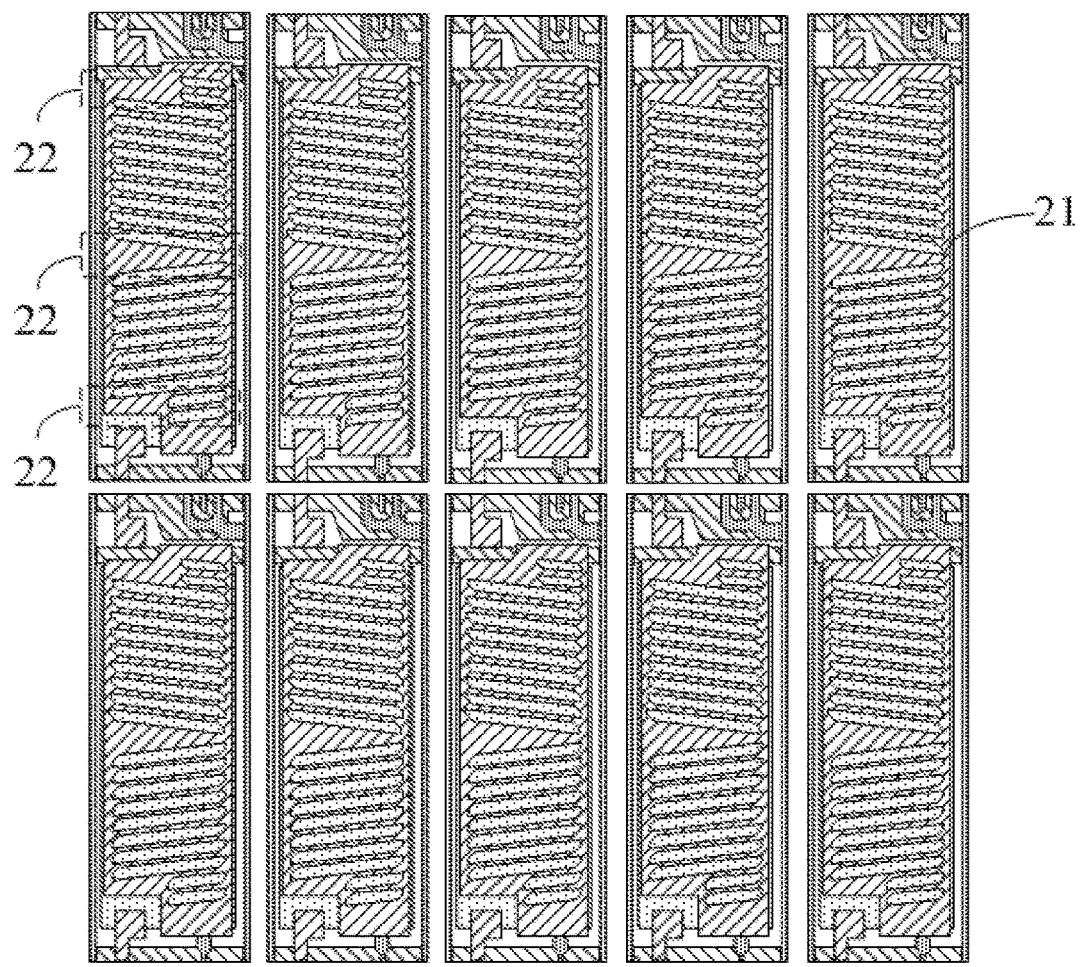
FIG. 2 is a schematic plan view of an array substrate in the related art.
Figure 3:
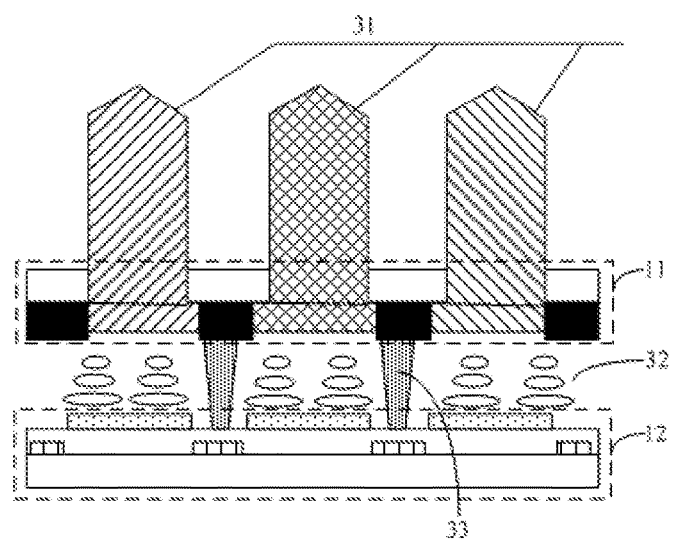
FIG. 3 is a schematic view showing light emitted by a plane liquid crystal display panel in the related art.
Figure 4:
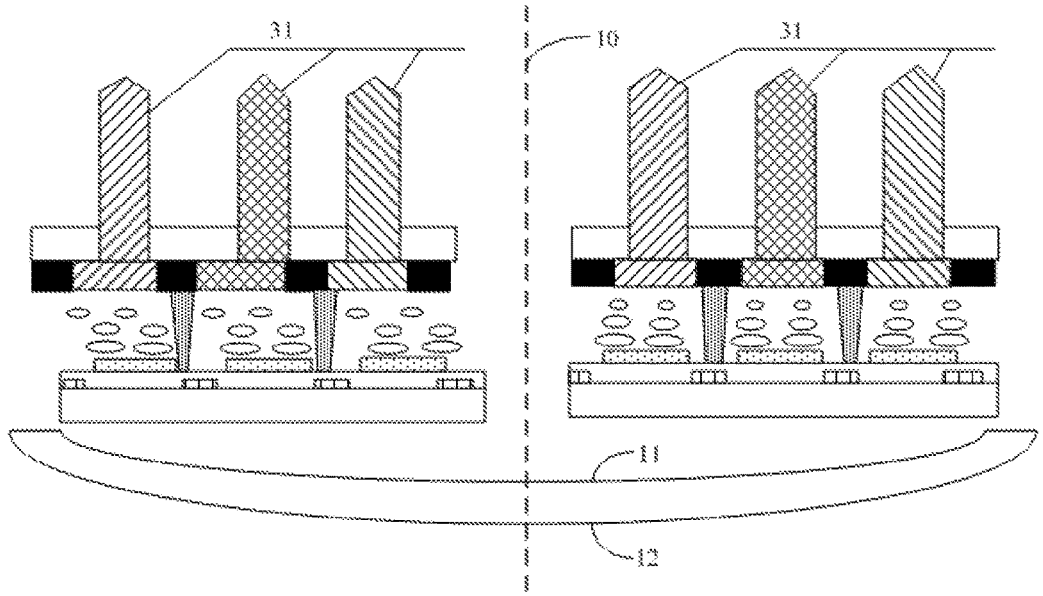
FIG. 4 is a schematic view showing light emitted by a curved liquid crystal display panel in the related art.

For better understanding the present disclosure, only profiles of the slits of the pixel electrodes in some embodiments of the present disclosure are shown in FIG. 5, but actual structures of the pixel electrodes are not limited to those shown in FIG. 5. For example, in some embodiments of the present disclosure, the pixel electrodes 52 having slits in shape of right angle bracket may be designed in accordance with the structures of the pixel electrodes shown in FIG. 2, which is not limited herein.

In some embodiments of the present disclosure, the pixel electrodes in any two adjacent pixel units in an identical row have different structures. The row direction is perpendicular to the extending direction of the central axis. In some embodiments, in the case that the pixel units are properly designed, the pixel electrodes in adjacent three, four or more pixel units in an identical row may have different structures, as long as the pixel electrodes in the pixel units are symmetrically arranged relative to the central axis of the array substrate. Optionally, in some embodiments of the present disclosure, the pixel electrodes in the pixel units located in an identical row and at one side of the central axis have an identical structure, and the pixel electrodes in the pixel units located in an identical row and at the other side of the central axis have an identical structure.

Optionally, in some embodiments of the present disclosure, the pixel electrodes in the pixel units located in an identical column have an identical structure, where the column direction is parallel to the extending direction of the central axis 53.

In some embodiments of the present disclosure, each pixel unit may include three sub-pixel units respectively corresponding to a red (R) light-filtering layer, a green (G) light-filtering layer and a blue (B) light-filtering layer on a color filter substrate. Of course, in some embodiments of the present disclosure, one pixel unit may include four sub-pixel units respectively corresponding to the R light-filtering layer, the G light-filtering layer, the B light-filtering layer and a white (W) light-filtering layer on the color filter substrate. In addition, in an actual design, the four sub-pixel units may respectively correspond to the R light-filtering layer, the G light-filtering layer, the B light-filtering layer and a yellow (Y) light-filtering layer on the color filter substrate. The correspondence between the sub-pixel units in one pixel unit and different light-filtering layers on the color filter substrate is not limited by the embodiments of the present disclosure.

Structures of the pixel electrodes in the pixel units, in a case that each pixel unit includes three sub-pixel units and a case that each pixel unit includes four sub-pixel units, are respectively described hereinafter in some embodiments of the present disclosure.

Figure 6:
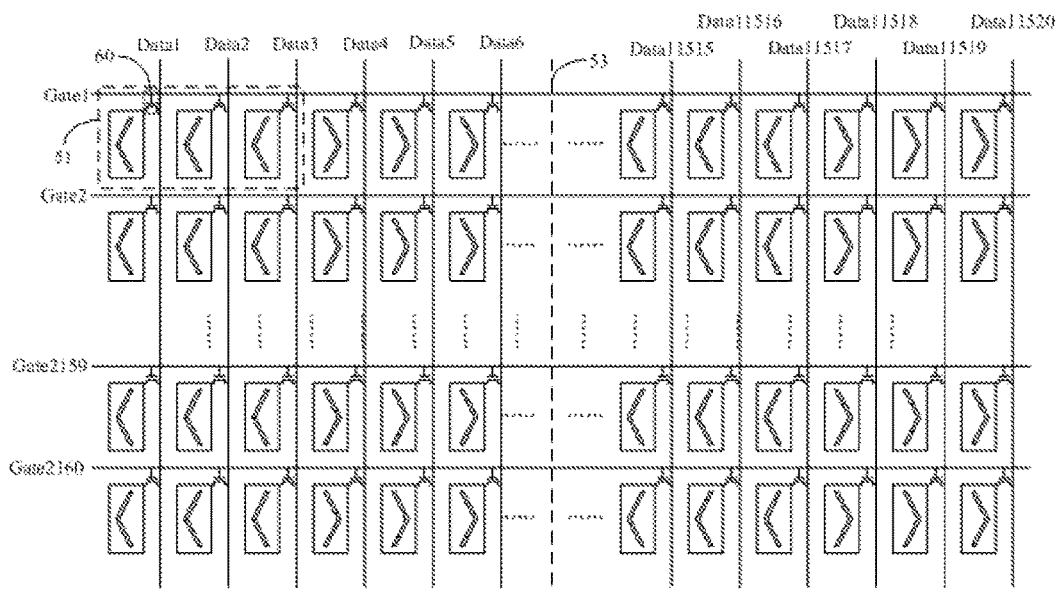
FIG. 6 is a schematic plan view of an array substrate in some embodiments of the present disclosure.
Figure 7:
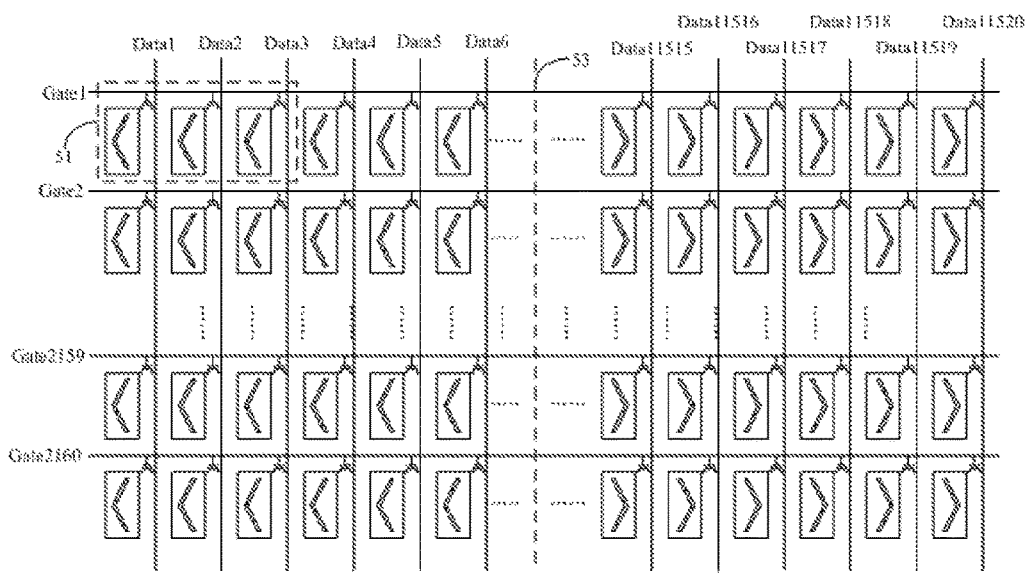
FIG. 7 is a schematic plan view of an array substrate in some embodiments of the present disclosure.

In some embodiments of the present disclosure, it is taken for example that the display resolution is 3840×2160. One pixel unit 51 includes three sub-pixel units. A long edge of each sub-pixel unit is in accordance with a short edge of the array substrate and a short edge of each sub-pixel unit is in accordance with a long edge of the array substrate, that is, the short edge of each sub-pixel unit is in accordance with a curving direction of a curved array substrate. As shown in FIG. 6 and FIG. 7, each sub-pixel unit is connected to a corresponding gate line and a corresponding data line via a thin film transistor 60 in the sub-pixel unit. In some embodiments of the present disclosure, the array substrate is provided with 2160 gate lines each extending in the horizontal direction, where the sub-pixel units in a first row are connected to a first gate line Gate1 and the sub-pixel units in a last row are connected to a last gate line Gate2160. In some embodiments of the present disclosure, the array substrate is provided with 11520 data lines each extending in the vertical direction, where the sub-pixel units in a first column are connected to a first data line Data1 and the sub-pixel units in a last column are connected to a last data line Data11520.

In some embodiments of the present disclosure, as shown in FIG. 6, the pixel electrodes in any two adjacent pixel units located in an identical row have different structures. In some embodiments of the present disclosure, the row direction is the horizontal direction. As shown in FIG. 6, the slits of the pixel electrodes in a first pixel unit located in the first row are in shape of left angle bracket, the slits of the pixel electrodes in a second pixel unit located in the first row are in shape of right angle bracket. In some embodiments of the present disclosure, the array substrate have 2160 rows of effective display pixels, and 1920 columns of pixel units at the left side of the central axis 53 and 1920 columns of pixel units at the right side of the central axis 53 are symmetrically arranged relative to the central axis 53. Among the 1920 columns of pixel units, the slits of the pixel electrodes in 960 columns of pixel units are in shape of left angle bracket and the slits of the pixel electrode in another 960 columns of pixel units are in shape of right angle bracket, and the pixel electrodes having different structures are alternately arranged. Optionally, in some embodiments of the present disclosure, the pixel electrodes in the pixel units located in an identical column have the same structure; here the column direction is the vertical direction.

As shown in FIG. 7, in some embodiments of the present disclosure, the pixel electrodes in the pixel units located in an identical row at one side of the central axis 53 have an identical structure, and the pixel electrodes in the pixel units located in an identical row at the other side of the central axis 53 have an identical structure. The pixel electrodes located at one side of the central axis 53 and the pixel electrodes located at the other side of the central axis 53 are symmetrically arranged relative to the central axis 53. For example, as shown in FIG. 7, the slits of the pixel electrodes located at the left side of the central axis 53 are in shape of left angle bracket, and the slits of the pixel electrodes located at the right side of the central axis 53 are in shape of right angle bracket. Optionally, in some embodiments of the present disclosure, the pixel electrodes in pixel units located in an identical column have an identical structure.

In some embodiments of the present disclosure, the pixel electrodes have two different structures. As shown in FIG. 6, the pixel electrodes having different structures are arranged alternately and periodically. As shown in FIG. 7, the pixel electrodes having different structures are respectively located at the left side and the right side of the central axis, and structures of the pixel electrodes at the left side of the central axis and structures of the pixel electrodes at the right side of the central axis are symmetrically arranged relative to the central axis.

In some embodiments of the present disclosure, when the array substrate and the color filter substrate that are oppositely arranged to form a cell are curved under external force, the pixel units at the left side and the right side of a central axis of a liquid crystal display panel formed by the array substrate and the color filter substrate have an identical quantity and are symmetrically arranged relative to the central axis. In compared with the related art, the movement of the color filter substrate in the present disclosure has same effect on deflections of the liquid crystals and transmittance, and accordingly, the panel may have an even transmittance and an even brightness. In addition, the manufacturing process for the array substrate in some embodiments of the present disclosure is simple, and the array substrate can be manufactured with the apparatus in the related art and there is no need to modify the apparatus.

In some embodiments of the present disclosure, it is also taken as an example that the display resolution is 3840× 2160. One pixel unit 51 includes four sub-pixel units. In some embodiments of the present disclosure, the four sub-pixel units are horizontally lined up or arranged in a two-by-two array. If the four sub-pixel units are horizontally lined up in some embodiments of the present disclosure, the specific arrangement of the pixel electrodes are similar to foregoing embodiments, which is not repeated herein. The case that the four sub-pixel units are arranged in a two-by-two array is detailed hereinafter in some embodiments of the present disclosure.

Figure 8:
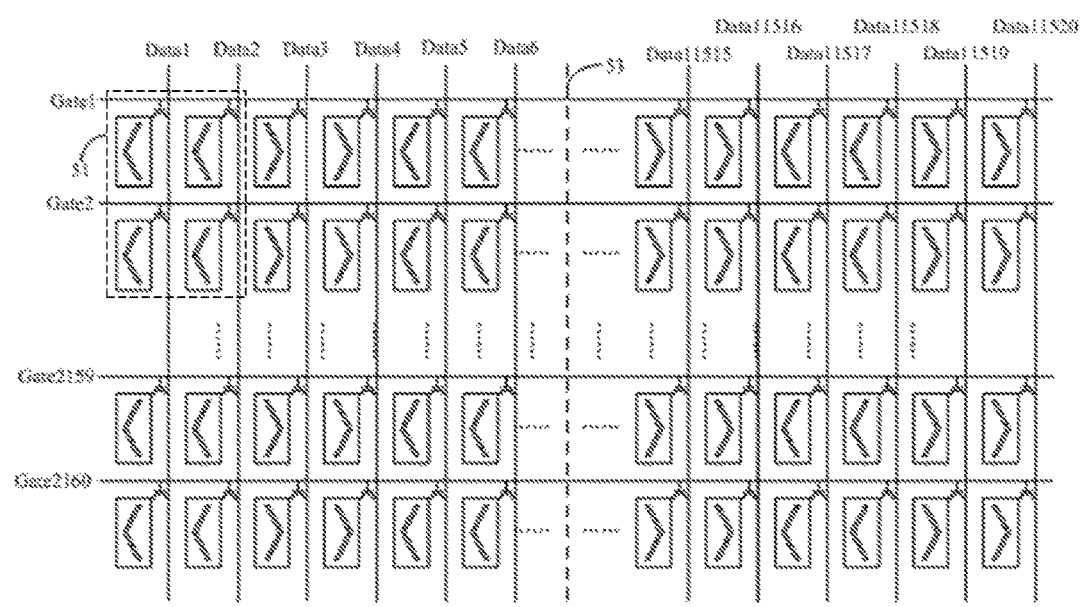
FIG. 8 is a schematic plan view of an array substrate in some embodiments of the present disclosure.

As shown in FIG. 8, in some embodiments of the present disclosure, a long edge of each sub-pixel unit is in accordance with a short edge of the array substrate, and a short edge of each sub-pixel unit is in accordance with a long edge of the array substrate, i.e., the short edge of each sub-pixel unit is in accordance with a curving direction of a curved array substrate. In some embodiments of the present disclosure, 2880 columns of pixel units at the left side of the central axis of the array substrate and 2880 columns of pixel units at the right side of the central axis of the array substrate are symmetrically arranged relative to the central axis. Among the 2880 columns of pixel units, the slits of the pixel electrodes in 2440 columns of pixel units are in shape of left angle bracket, while the slits of the pixel electrodes in the other 2440 columns of pixel units are in shape of right angle bracket, and the pixel electrodes having different structures are alternately arranged. In some embodiments of the present disclosure, the array substrate is provided with 1080 rows of pixel units, where 540 rows of sub-pixel units correspond to the R light-filtering layer and the B light-filtering layer respectively and the other 540 rows of sub-pixel units correspond to the G light-filtering layer and the W light-filtering layer. The sub-pixel units corresponding to the R light-filtering layer and the B light-filtering layer and the sub-pixel units corresponding to the G light-filtering layer and the W light-filtering layer are arranged alternately. Optionally, in some embodiments of the present disclosure, the pixel electrodes in the pixel units located in an identical column have an identical structure.

Obviously, in some embodiments of the present disclosure, the pixel electrodes in the pixel units located in an identical row and at one side of the central axis 53 may be designed with an identical structure, and the pixel electrodes in the pixel units located in an identical row and at the other side of the central axis 53 may be designed with an identical structure. Such arrangement manner is similar to that mentioned in foregoing embodiments and is not repeated herein.

When the array substrate according to embodiments of the present disclosure and the color filter substrate that are oppositely arranged to form a cell are curved under external force, although transmittances of pixel units formed by pixel electrodes having different structures may be influenced differently, since the pixel units at the left side of a central axis of a liquid crystal display panel formed by the array substrate and the color filter substrate and the pixel units at the right side of the central axis have an identical quantity and are symmetrically arranged relative to the central axis, the movement of the color filter substrate in the present disclosure has same effect on deflections of the liquid crystals and transmittance, and accordingly, the panel may have an even transmittance and an even brightness, in compared with the related art.

The present disclosure further provides in some embodiments a curved display panel, which includes an array substrate and an alignment substrate. After the array substrate and the alignment substrate are oppositely arranged to form a cell, a section along an extending direction of a long axis of the array substrate has an arc surface. The array substrate is in accordance with any array substrate according to the foregoing embodiments.

The present disclosure further provides in some embodiments a curved display device, which includes the above-mentioned curved display panel. The curved display device may include a liquid crystal panel, a liquid crystal display, a liquid crystal television, an organic light-emitting diode (OLED) panel, an OLED display, an OLED television, an electronic paper, or the like.

In sum, the present disclosure provides the array substrate in some embodiments. The array substrate includes multiple pixel units arranged in a matrix. Each pixel unit includes at least two sub-pixel units. Each sub-pixel unit is provided with one pixel electrode and one common electrode. The pixel electrodes and/or the common electrodes in an identical pixel unit have an identical structure, and the pixel electrodes and/or the common electrodes in different pixel units have at least two different structures, e.g., a first structure and a second structure. The pixel electrodes or the common electrodes are symmetrically arranged relative to the central axis of the array substrate. The central axis is a straight line at a middle portion of the array substrate and extending in a direction parallel to the array substrate. The extending direction of the central axis does not change when the array substrate is curved. When the array substrate in the embodiments of the present disclosure and the color filter substrate that are oppositely arranged to form a cell are curved under external force, since the pixel electrodes or the common electrodes in an identical pixel unit have an identical structure, the pixel electrodes or the common electrodes in different pixel units have at least two different structures, and the pixel electrodes or the common electrodes are symmetrically arranged relative to the central axis of the array substrate, the pixel units at the left side of a central axis of a liquid crystal display panel formed by the array substrate and the color filter substrate and the pixel units at the right side of the central axis of the liquid crystal display panel have an identical quantity and are symmetrically arranged relative to the central axis. Compared with designing the pixel electrodes with only one structure, the movement of the color filter substrate in some embodiments of the present disclosure has same effect on deflections of the liquid crystals and transmittance, and accordingly, the panel may have an even transmittance and an even brightness, thereby improving the visual effect and the image quality.

Obviously, the ordinary skilled in the art can make various modifications and changes without departing from the principle and scope of the present disclosure, and the present disclosure intends to include all those modifications and changes if they fall within the scope of protection of claims of the present disclosure and equivalent technologies.

The invention claimed is:

1. An array substrate, comprising a plurality of pixel units arranged in a matrix, wherein each pixel unit comprises at least two sub-pixel units, and each sub-pixel unit is provided with a pixel electrode and a common electrode;
wherein the pixel electrodes and/or the common electrodes in an identical pixel unit have an identical structure, and the pixel electrodes and/or the common electrodes in different pixel units have at least two structures comprising a first structure and a second structure; and
wherein the pixel electrodes or the common electrodes are symmetrically arranged relative to a central axis of the array substrate, the central axis is a straight line at a middle portion of the array substrate and extending in a direction parallel to the array substrate, and an extending direction of the central axis does not change in the case that the array substrate is curved;
wherein each pixel unit comprises three sub-pixel units, and the pixel electrodes or the common electrodes in any two adjacent pixel units located in an identical row have different structures, wherein a row direction is perpendicular to the extending direction of the central axis.

2. The array substrate according to claim 1, wherein each pixel unit comprises four sub-pixel units, the four sub-pixel units are horizontally lined up or arranged in a two-by-two array, and the pixel electrodes or the common electrodes in any two adjacent pixel units located in an identical row have different structures, wherein the row direction is perpendicular to the extending direction of the central axis.

3. The array substrate according to claim 1, wherein the pixel electrodes or the common electrodes in the pixel units located in an identical column have an identical structure, and a column direction is parallel to the extending direction of the central axis.

4. The array substrate according to claim 3, wherein each pixel electrode or each common electrode comprises a group of slits, the slits of the pixel electrodes or the common electrodes are symmetrically arranged relative to the central axis of the array substrate, and each pixel electrode or each common electrode comprises a plurality of slits bending toward an identical direction;
  each slit of the pixel electrodes or the common electrodes having the first structure comprises a bending point at a middle portion of the corresponding slit and bends toward a first direction, or each slit of the pixel electrodes or the common electrodes having the first structure inclines toward the first direction;
  each slit in the pixel electrodes or the common electrodes having the second structure comprises a bending point at a middle portion of the corresponding slit and bends toward a second direction, or each slit of the pixel electrodes or the common electrodes having the second structure inclines toward the second direction;
  wherein the first direction is opposite to the second direction, and the first and the second directions are both perpendicular to the central axis.

5. The array substrate according to claim 4, wherein the bending point at the middle portion of each slit of the pixel electrodes or the common electrodes and two terminals of the corresponding slit form an isosceles triangle, wherein the bending point is a vertex of the isosceles triangle.

6. The array substrate according to claim 4, wherein a portion of each slit of the pixel electrodes or the common electrodes between the bending point at the middle portion of the corresponding slit and each of two terminals of the corresponding slit is straight; or
  a portion of each slit of the pixel electrodes or the common electrodes between the bending point at the middle portion of the corresponding slit and each of two terminals of the corresponding slit is curved.

7. The array substrate according to claim 1, wherein quantities of the pixel units in respective rows are identical and quantities of the sub-pixel units in respective pixel units are identical;
  wherein quantities of the pixel units located in an identical row and at two sides of the central axis are identical, and structures of the pixel units located in the identical row and at the two sides of the central axis are symmetrically arranged relative to the central axis, wherein a row direction is perpendicular to the extending direction of the central axis.

8. The array substrate according to claim 1, wherein quantities of the pixel electrodes or the common electrodes in respective rows are identical;
  wherein the quantities of the pixel electrodes or the common electrodes located in an identical row and at two sides of the central axis are identical, and structures of the pixel electrodes or the common electrodes located in the identical row and at the two sides of the central axis are symmetrically arranged relative to the central axis, wherein the row direction is perpendicular to the extending direction of the central axis.

9. The array substrate according to claim 4, wherein the slits of the pixel electrodes or the common electrodes in an identical pixel unit bend toward an identical direction.

10. A curved display panel, comprising the array substrate according to claim 1 and an alignment substrate, wherein after the array substrate and the alignment substrate are oppositely arranged to form a cell, a section along an extending direction of a long axis of the array substrate has an arc surface.

11. A curved display device, comprising the curved display panel according to claim 10.

12. The array substrate according to claim 2, wherein the pixel electrodes or the common electrodes in the pixel units located in an identical column have an identical structure, and a column direction is parallel to the extending direction of the central axis.

13. The array substrate according to claim 2, wherein the pixel electrodes or the common electrodes in respective rows have an identical quantity;
  wherein the pixel electrodes or the common electrodes located in an identical row and at two sides of the central axis have an identical quantity, and structures of the pixel electrodes or the common electrodes located in the identical row and at the two sides of the central axis are symmetrically arranged relative to the central axis, wherein the row direction is perpendicular to the extending direction of the central axis.

14. An array substrate, comprising a plurality of pixel units arranged in a matrix, wherein each pixel unit comprises at least two sub-pixel units, and each sub-pixel unit is provided with a pixel electrode and a common electrode;
  wherein the pixel electrodes and/or the common electrodes in an identical pixel unit have an identical structure, and the pixel electrodes and/or the common electrodes in different pixel units have at least two structures comprising a first structure and a second structure; and
  wherein the pixel electrodes or the common electrodes are symmetrically arranged relative to a central axis of the array substrate, the central axis is a straight line at a middle portion of the array substrate and extending in a direction parallel to the array substrate, and an extending direction of the central axis does not change in the case that the array substrate is curved;
  wherein each pixel unit comprises three sub-pixel units, the pixel electrodes or the common electrodes in the pixel units located in an identical row at one side of the central axis have an identical structure, and the pixel electrodes or the common electrodes in the pixel units located in an identical row at the other side of the central axis have an identical structure, wherein a row direction is perpendicular to the extending direction of the central axis.

15. The array substrate according to claim 14, wherein the pixel electrodes or the common electrodes in the pixel units located in an identical column have an identical structure, and a column direction is parallel to the extending direction of the central axis.

16. The array substrate according to claim 14, wherein quantities of the pixel electrodes or the common electrodes in respective rows are identical;
  wherein the quantities of the pixel electrodes or the common electrodes located in an identical row and at two sides of the central axis are identical, and structures of the pixel electrodes or the common electrodes located in the identical row and at the two sides of the central axis are symmetrically arranged relative to the central axis, wherein the row direction is perpendicular to the extending direction of the central axis.

17. An array substrate, comprising a plurality of pixel units arranged in a matrix, wherein each pixel unit comprises at least two sub-pixel units, and each sub-pixel unit is provided with a pixel electrode and a common electrode;

wherein the pixel electrodes and/or the common electrodes in an identical pixel unit have an identical structure, and the pixel electrodes and/or the common electrodes in different pixel units have at least two structures comprising a first structure and a second structure; and wherein the pixel electrodes or the common electrodes are symmetrically arranged relative to a central axis of the array substrate, the central axis is a straight line at a middle portion of the array substrate and extending in a direction parallel to the array substrate, and an extending direction of the central axis does not change in the case that the array substrate is curved;

wherein each pixel unit comprises four sub-pixel units, the four sub-pixel units are horizontally lined up or arranged in a two-by-two array, the pixel electrodes or the common electrodes in the pixel units located in an identical row at one side of the central axis have an identical structure, and the pixel electrodes or the common electrodes in the pixel units located in an identical row at the other side of the central axis have an identical structure, wherein a row direction is perpendicular to the extending direction of the central axis.

18. The array substrate according to claim 17, wherein the pixel electrodes or the common electrodes in the pixel units located in an identical column have an identical structure, and a column direction is parallel to the extending direction of the central axis.

19. The array substrate according to claim 17, wherein quantities of the pixel electrodes or the common electrodes in respective rows are identical;

wherein the quantities of the pixel electrodes or the common electrodes located in an identical row and at two sides of the central axis are identical, and structures of the pixel electrodes or the common electrodes located in the identical row and at the two sides of the central axis are symmetrically arranged relative to the central axis, wherein the row direction is perpendicular to the extending direction of the central axis.

* * * * *